United States Patent [19]

Menniti et al.

[11] Patent Number: 4,700,282

[45] Date of Patent: Oct. 13, 1987

[54] MONOLITHICALLY INTEGRATABLE CONTROL CIRCUIT HAVING A PUSH-PULL OUTPUT STAGE FOR THE SWITCHING OF INDUCTIVE LOADS

[75] Inventors: Pietro Menniti, Milan; Angelo Alzati, Bollate, both of Italy

[73] Assignee: SGS Microelettronica SpA, Milan, Italy

[21] Appl. No.: 907,680

[22] Filed: Sep. 15, 1986

[30] Foreign Application Priority Data

Sep. 23, 1985 [IT] Italy ............................... 22245 A/85

[51] Int. Cl.$^4$ ........................................... H02M 7/538
[52] U.S. Cl. ..................................... 363/56; 307/255; 307/300; 330/268; 363/132
[58] Field of Search ................. 363/56, 132; 307/255, 307/300; 330/267, 268

[56] References Cited

U.S. PATENT DOCUMENTS

| 4,205,273 | 5/1980 | Yoshida | 330/267 |
| 4,586,001 | 4/1986 | Pye | 330/267 |
| 4,612,452 | 9/1986 | Stephani et al. | 307/300 |

FOREIGN PATENT DOCUMENTS 140309 11/1980 Japan ................................. 330/268

OTHER PUBLICATIONS

Farkas, "Well-protected Power-transistor Bridge Drives Servos, Turns Off Quickly," Electronic Design, vol. 29, No. 8, pp. 192-194, Apr. 16, 1981.

Primary Examiner—William H. Beha, Jr.
Attorney, Agent, or Firm—Wenderoth, Lind & Ponack

[57] ABSTRACT

A monolithically integratable control circuit for the switching of inductive loads, have a push-pull output stage formed by transistors each having their base terminal connected to a control circuit and to a charge extraction transistor driven to conduct at saturation in phase opposition with respect to the output transistor to which it is connected. This charge extraction transistor has its base terminal connected via a diode to the control circuit and to a biasing resistor.

24 Claims, 2 Drawing Figures

4,700,282

MONOLITHICALLY INTEGRATABLE CONTROL CIRCUIT HAVING A PUSH-PULL OUTPUT STAGE FOR THE SWITCHING OF INDUCTIVE LOADS

BACKGROUND OF THE INVENTION

The present invention relates to control circuits for the switching of inductive loads. More particularly, the present invention relates to a monolithically integratable control circuit comprising a push-pull transistor output stage which may be used to drive relays, solenoids and D.C. motors.

The simplest type of push-pull transistor output stage is formed by a pair of complementary transistors operating in class B. These transistors are inserted in series, by means of their emitter and collector terminals, between the two terminals of a supply voltage and are alternately driven to conduct, in phase opposition, by their base terminals.

This leads to opposite current flows in the load which is connected to an output terminal formed by the point of connection between the two transistors.

Since the switching of each of the transistors of the output stage does not take place instantaneously, but with a time transient whose duration is not negligible when the transistors are conducting at saturation, the simultaneous conduction of the two transistors cannot be avoided during the switching of the output stage if they are simply controlled in phase opposition.

The simultaneous conduction of the two transistors generally leads to an undesired increase in the dissipation of power in the output stage itself.

When the load connected to the output stage is of an inductive type, the counter-electromotive force induced during switching of the output stage by the current passing through it abruptly raises the collector-emitter voltage of the transistor in the cut-off phase which is still, however, conducting, thereby causing a power dissipation peak in this transistor which may in some cases have destructive effects.

For this reason, it is necessary to prevent the transistors of a push-pull output stage included in a control circuit for the switching of inductive loads from conducting simultaneously during switching. The simplest solution to this problem would be, in a control circuit with a push-pull output stage, to provide the conduction command for the output transistor which is cut off with a suitable delay with respect to the cut-off command for the transistor in conduction.

In practice, the application of this solution to a control circuit would entail the use of comparatively complex circuit means which would therefore be costly in terms of integration areas.

U.S. Pat. No. 4,612,452 issued Sept. 16, 1986, to Fabrizio Stefani et al. discloses a control circuit for the switching of inductive loads based on a different operating principle which is more viable from an industrial point of view.

This control circuit, a diagram of which is shown in FIG. 1, comprises an output stage with a bipolar PNP transistor $T_1$ and a bipolar NPN transistor $T_2$ whose collector terminals are connected together to form an output terminal of the circuit.

The emitter terminals of $T_1$ and $T_2$ are respectively connected to the positive terminal $+V_{cc}$ and the negative terminal $-V_{cc}$ of a supply voltage. The base terminal of the transistor $T_1$ is connected to the collector terminal of a bipolar PNP transistor $T_3$. The base terminal of the transistor $T_2$ is connected to the collector terminal of a bipolar NPN transistor $T_4$.

The emitter terminals of the transistors $T_3$ and $T_4$ are respectively connected to the positive terminal $+V_{cc}$ and the negative terminal $-V_{cc}$.

The base terminals of the transistors $T_1$ and $T_4$ are respectively connected to the collector terminal and the emitter terminal of a bipolar NPN transistor $T_{14}$.

The base terminals of the transistors $T_3$ and $T_2$ are respectively connected to the collector terminal and the emitter terminal of a bipolar NPN transistor $T_{23}$.

The base terminals of the transistors $T_{14}$ and $T_{23}$ are connected to a circuit control means, shown by a rectangular block designated by the letter C formed, for example, by the differential structure described in the above-mentioned patent.

This circuit control means C is connected to a switching signal source shown in FIG. 1 by a block SW and in response to the switching signals generated by source SW, drive the transistors $T_{14}$ and $T_{23}$ to conduct alternately. Consequently, when the transistors $T_1$ and $T_4$ are conducting, the transistors $T_2$ and $T_3$ are cut off and vice versa. The transistors $T_1$ and $T_2$ of the output stage are driven to conduct at saturation.

In accordance with the above-mentioned patent the transistors $T_3$ and $T_4$ also conduct at saturation.

For understanding of the operation of the circuit it is assumed that a switching signal causes the cut-off of the transistor $T_{14}$ and the conduction of the transistor $T_{23}$.

The transistor $T_3$ begins, with a negligible delay, to conduct at saturation and it extracts charges from the base of the transistor $T_1$, thereby reducing the duration of the switching transient from saturation to the cut-off of this transistor. The transistor $T_4$ continues, however, to conduct, initially at saturation until the charges stored in its base are depleted. During this transient, the transistor $T_4$ continues to absorb the emitter current of the transistor $T_{23}$, thereby preventing the conduction of the transistor $T_2$ which consequently switches with a delay determined by the saturation conditions of the transistor $T_4$.

The transistors $T_3$ and $T_4$, by accelerating the cut-off of the transistor $T_1$ and delaying the conduction of the transistor $T_2$, make it possible to prevent the simultaneous conduction of the transistors $T_1$ and $T_2$ or to limit its duration appropriately such that it does not harm the integrity of the device itself.

The operation of the circuit is identical and symmetrical in the opposite switching case. That is, the transistor $T_4$ accelerates the cut-off of the transistor $T_2$, while the transistor $T_3$ delays the conduction of the transistor $T_1$ thereby preventing the damaging effects of simultaneous conduction in this case as well.

The economic viability of this solution is clear from the fact that any damaging simultaneous conduction may be avoided simply by using two conventional bipolar transistors Thd 3 and $T_4$ as additional components.

In addition, the transistors $T_3$ and $T_4$ do not entail any supply current absorption increase since the base current of the output transistor $T_1$ being supplied as an output is re-used, via the transistor $T_{14}$, as an input base current for the transistor $T_4$ (less the negligible base current of the transistor $T_{14}$) and the base current, being supplied as an input, of the transistor $T_2$ is re-used, via the transistor $T_{23}$, as the output base current of the transistor $T_3$ (less the negligible base current of the transistor $T_{23}$).

However, the control circuit for the switching of inductive loads described above may be subject, when embodied in practice as a monolithically integrated circuit, to a drawback which is closely linked to technological problems connected with this application.

As known to persons skilled in the art, there is a possibility of leakage currents from the transistors of an integrated circuit even when these are kept cut off. In the case in question, leakage currents from the transistor $T_{14}$ and $T_{23}$ may lead to undesired re-conduction of the transistor $T_3$ and $T_4$ with detrimental effects on the accuracy of control of the output transistors $T_1$ and $T_2$.

SUMMARY OF THE INVENTION

The object of the present invention is to provide a monolithically integratable control circuit for the switching of inductive loads which costs the same to produce as known circuits, while providing greater operational reliability.

This object may be achieved by providing a monolithically integratable control circuit for the switching of inductive loads comprising a push-pull output stage formed of a first and a second circuit means, each means having a first, a second and a control terminal and each means having its first and second terminals connected between a first terminal and a second terminal of a supply voltage, and said control terminals of said first and second circuit means being both coupled to a control circuit means connected to a source of switching signals such that said circuit control means, in response to said switching signals, enables said first and second circuit means alternately conduct; said control circuit further comprising a first and a second transistor for charge extraction, each transistor having a first, a second and a control terminal; said first transistor for charge extraction having its first and second terminals connected between said terminal of said supply voltage to which said first circuit means is connected and said control terminal of said first circuit means, and said second transistor for charge extraction having its first and second terminals connected between said terminal of said supply voltage to which said second circuit means is connected and said control terminal of said second circuit means, and said control terminals of said first and second transistors for charge extraction being coupled to said circuit control means which controls said first and second transistors for charge extraction when said second and first circuit means are respectively enabled to conduct, wherein said first and second transistors for charge extraction are commanded to conduct for a predetermined period of time whose duration is no less than that of a period of time during which said second and first circuit means respectively remain enabled to conduct; said control terminal of said first transistor for charge extraction being coupled to said circuit control means via a first circuit component with a monodirectional conduction characteristic having a first terminal connected to said control terminal of said first transistor and having a second terminal connected to both said circuit control means and, via a first resistor, to said terminal of said supply voltage to which said first transistor for charge extraction is connected, and said control terminal of said second transistor for charge extraction being coupled to said circuit control means via a second circuit component with a monodirectional conduction characteristic having a first terminal connected to both said circuit control means and, via a second resistor, to said terminal of said supply voltage to which said second transistor for charge extraction is connected, and having a second terminal connected to said control terminal of said second transistor for charge extraction.

BRIEF DESCRIPTION OF THE DRAWINGS

The invention is described in further detail in the following description given purely by way of non-limiting example with reference to the attached drawings, in which.

The same reference numerals and letters are used in the figures for corresponding components.

DESCRIPTION OF THE PREFERRED EMBODIMENT

Figure 2:
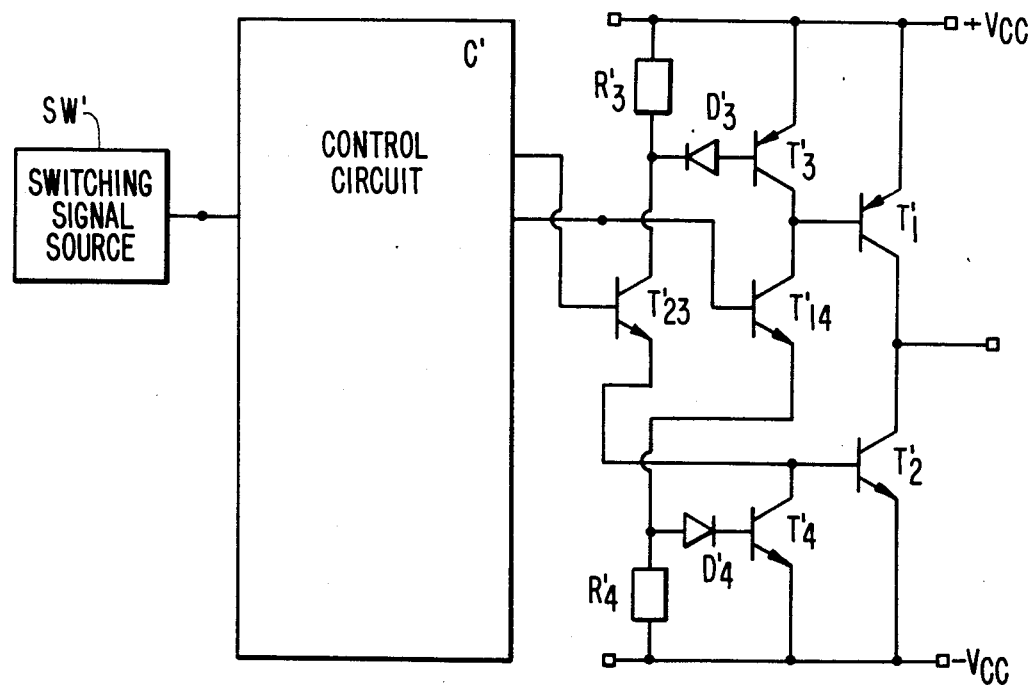
FIG. 2 is a diagram, partly in block form, of a control circuit in accordance with the present invention for the switching of inductive loads.

The diagram of FIG. 2 of a control circuit of the invention comprises an output stage with a bipolar PNP transistor $T'_1$ and a bipolar NPN transistor $T'_2$, whose collector terminals are connected together to form an output terminal of the circuit itself.

The emitter terminals of the transistors $T'_1$ and $T'_2$ are connected to the positive terminal $+V_{cc}$ and the negative terminal $-V_{cc}$ respectively of a supply voltage and the base terminals of these transistors are connected to a circuit control means shown by a rectangular block designated by the symbol C'.

This circuit control means C' is connected to a switching signal source shown in FIG. 2 by a block SW' and, in response to the supply of switching signals generated by source SW', drives the transistors $T'_1$ and $T'_2$ to conduct alternately.

Figure 1:
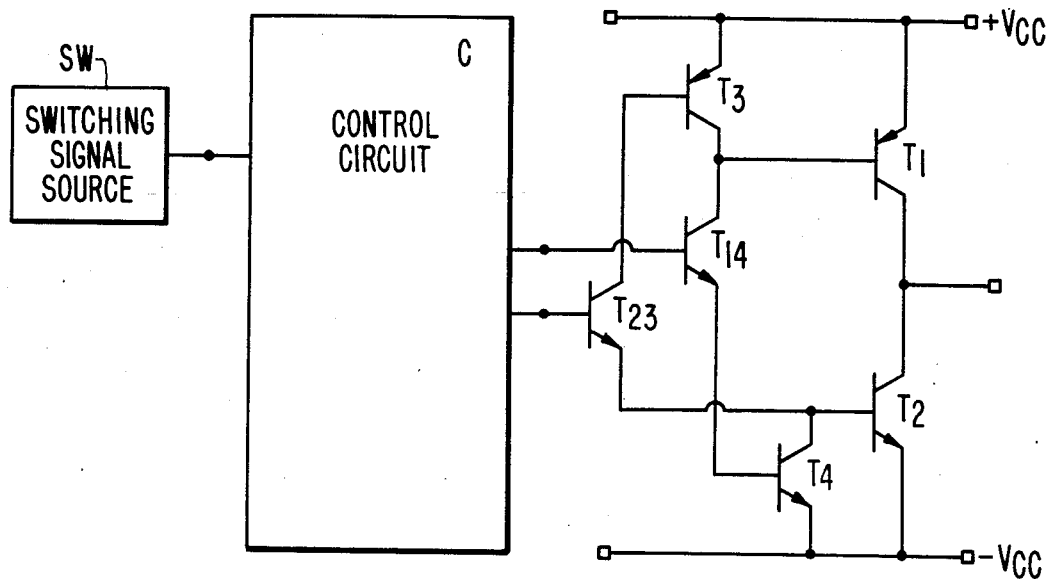
FIG. 1 is a diagram, partly in block form, of a known control circuit for the switching of inductive loads.

The circuit means C' may be embodied by a circuit which is equivalent to the circuit means C shown in the diagram of FIG. 1.

The collector terminal of a bipolar PNP transistor $T'_3$ is connected to the base of the transistor $T'_1$. The collector terminal of a bipolar NPN transistor $T'_4$ is connected to the base terminal of the transistor $T'_2$.

The emitter terminals of the transistors $T'_3$ and $T'_4$ are respectively connected to the positive terminal $+V_{cc}$ and the negative terminal $-V_{cc}$.

The base terminals of the transistors $T'_3$ and $T'_4$ are respectively connected to the anode of a first diode $D'_3$ and the cathode of a second diode $D'_4$.

The cathode of the diode $D'_3$ is connected to both the collector of $T'_{23}$ and, via a first resistor $R'_3$, to the positive terminal $+V_{cc}$.

The anode of the diode $D'_4$ is connected to both the emitter of $t'_{14}$ and, via a second resistor $R'_4$, to the negative terminal $-V_{cc}$.

The circuit control means C' via transistors $t'_{14}$ and $t'_{23}$ simultaneously causes the transistor $T'_1$ and $T'_4$ to conduct and cuts off the transistors $T'_2$ and $T'_3$ and vice versa in accordance with the switching signals generated by the source SW'.

The operation of a control circuit of the invention is identical to that described with reference to the known circuit of FIG. 1. The function of the transistors $T'_3$ and $T'_4$ is completely identical to that of the transistor $T_3$ and $T_4$.

The resistors $R'_3$ and $R'_4$ make it possible to accurately respectively determine a base current threshold for the conduction of the transistors $T'_3$ and $T'_4$.

In this case, the minimum base current values required for the conduction of these transistors are respectively:

$$\frac{V'_{D3} + V'_{BE3}}{R'_3} \text{ and } \frac{V'_{D4} + V'_{BE4}}{R'_4}$$

wherein $V'_{D3}$ and $V'_{D4}$ respectively indicate the junction voltage of the diodes $D'_3$ and $D'_4$, $V'_{BE3}$ and $V'_{BE4}$ indicate the base-emitter junction voltages of the transistors $T'_3$ and $T'_4$. By selecting suitable values for the resistors $R'_3$ and $R'_4$, it is possible to establish current thresholds designed to prevent with absolute certainty undesired conduction of the transistors $T'_3$ and $T'_4$ due solely to leakage currents from the circuit control means C' and transistors $T'_{14}$ and $T'_{23}$.

In addition, the diodes $D'_3$ and $D'_4$ respectively prevent a discharge of charges from the bases of the transistors $T'_3$ and $T'_4$ via the resistors $R'_3$ and $R'_4$ when these transistors, which conduct at saturation, are in the cut-off stage during switching. In this way, there is no risk of variations in the durations of the cut-off transients of the transistors $T'_3$ and $T'_4$ which could lead to harmful simultaneous conduction of the output transistors $T'_1$ and $T'_2$.

The required operational accuracy is therefore obtained using very simple and inexpensive circuit means, e.g. — two resistors and two diodes.

Although a single embodiment of the invention has been described and illustrated, it is evident that many variants are possible without departing from the scope of the invention.

The diodes could be replaced by other circuit components with monodirectional conduction characteristics and even the transistors of the output stage could be replaced by equivalent circuit components, comprising several transistors, as known to persons skilled in the art.

The circuit control means C' may be embodied in any way known to persons skilled in the art.

We claim:

1. A monolithically integratable control circuit for the switching of inductive loads comprising a, push-pull output stage formed of a first and a second circuit means, each means having a first, a second and a control terminal and each means having its first and second terminals connected between a first terminal and a second terminal of a supply voltage, and said control terminals of said first and second circuit means being both coupled to a control circuit means connected to a source of switching signals such that said circuit control means, in response to said switching signals, enables said first and second circuit means alternately conductive; said control circuit further comprising a first and a second transistor for charge extraction, each transistor having a first, a second and a control terminal; said first transistor for charge extraction having its first and second terminals connected between said terminal of said supply voltage to which said first circuit means is connected and said control terminal of said first circuit means, and said second transistor for charge extraction having its first and second terminals connected between said terminal of said supply voltage to which said second circuit means is connected and said control terminal of said second circuit means, and said control terminals of said first and second transistors for charge extraction being coupled to said circuit control means which controls said first and second transistors for charge extraction when said second and first circuit means are respectively enabled to conduct, wherein said first and second transistors for charge extraction are commanded to conduct for a predetermined period of time whose duration is no less than that of a period of time during which said second and first circuit means respectively remain enabled to conduct; said control terminal of said first transistor for charge extraction being coupled to said circuit control means via a first circuit component with a monodirectional conduction characteristic having a first terminal connected to said control terminal of said first transistor and having a second terminal connected to both said circuit control means and, via a first resistor, to said terminal of said supply voltage to which said first transistor for charge extraction is connected, and said control terminal of said second transistor for charge extraction being coupled to said circuit control means via a second circuit component with a monodirectional conduction characteristic having a first terminal connected to both said circuit control means and, via a second resistor, to said terminal of said supply voltage to which said second transistor for charge extraction is connected, and having a second terminal connected to said control terminal of said second transistor for charge extraction.

2. A control circuit as claimed in claim 1, wherein said first and second circuit means comprise semiconductor elements having opposite types of conductivity; said first terminal of said first circuit means and said first terminal of said second circuit means being respectively connected to said first and second terminals of said supply voltage, and said second terminals of said first and second circuit means being connected together to form an output terminal of said control circuit and said first and second transistors for charge extraction have conductivities which respectively are identical to that of said first and the second circuit means.

3. A control circuit as claimed in claim 1, wherein said first and second circuit means comprise transistors.

4. A control circuit as claimed in claim 2, wherein said first and second circuit means comprise transistors.

5. A control circuit as claimed in claim 3, wherein said first and second circuit means and said first and second transistor for charge extraction are bipolar transistors; said first terminal, control terminal and second terminal of each respectively being its emitter, base and collector terminals.

6. A control circuit as claimed in claim 4, wherein said first and second circuit means and said first and second transistor for charge extraction are bipolar transistors; said first terminal, control terminal and second terminal of each respectively being its emitter, base and collector terminals.

7. A control circuit as claimed in claim 1, wherein said first and the second transistors for charge extraction conduct at saturation.

8. A control circuit as claimed in claim 2, wherein said first and the second transistors for charge extraction conduct at saturation.

9. A control circuit as claimed in claim 3, wherein said first and the second transistors for charge extraction conduct at saturation.

10. A control circuit as claimed in claim 4, wherein said first and the second transistors for charge extraction conduct at saturation.

11. A control circuit as claimed in claim 5, wherein said first and the second transistors for charge extraction conduct at saturation.

12. A control circuit as claimed in claim 6, wherein said first and the second transistors for charge extraction conduct at saturation.

13. A control circuit as claimed in claim 1, wherein said first and the second circuit components with monodirectional conduction characteristics are diodes, said first and second terminals of each of said diodes respectively being an anode and cathode thereof.

14. A control circuit as claimed in claim 2, wherein said first and the second circuit components with monodirectional conduction characteristics are diodes, said first and second terminals of each of said diodes respectively being an anode and cathode thereof.

15. A control circuit as claimed in claim 3, wherein said first and the second circuit components with monodirectional conduction characteristics are diodes, said first and second terminals of each of said diodes respectively being an anode and cathode thereof.

16. A control circuit as claimed in claim 4, wherein said first and the second circuit components with monodirectional conduction characteristics are diodes, said first and second terminals of each of said diodes respectively being an anode and cathode thereof.

17. A control circuit as claimed in claim 5, wherein said first and the second circuit components with monodirectional conduction characteristics are diodes, said first and second terminals of each of said diodes respectively being an anode and cathode thereof.

18. A control circuit as claimed in claim 6, wherein said first and the second circuit components with monodirectional conduction characteristics are diodes, said first and second terminals of each of said diodes respectively being an anode and cathode thereof.

19. A control circuit as claimed in claim 7, wherein said first and the second circuit components with monodirectional conduction characteristics are diodes, said first and second terminals of each of said diodes respectively being an anode and cathode thereof.

20. A control circuit as claimed in claim 8, wherein said first and the second circuit components with monodirectional conduction characteristics are diodes, said first and second terminals of each of said diodes respectively being an anode and cathode thereof.

21. A control circuit as claimed in claim 9, wherein said first and the second circuit components with monodirectional conduction characteristics are diodes, said first and second terminals of each of said diodes respectively being an anode and cathode thereof.

22. A control circuit as claimed in claim 10, wherein said first and the second circuit components with monodirectional conduction characteristics are diodes, said first and second terminals of each of said diodes respectively being an anode and cathode thereof.

23. A control circuit as claimed in claim 11, wherein said first and the second circuit components with monodirectional conduction characteristics are diodes, said first and second terminals of each of said diodes respectively being an anode and cathode thereof.

24. A control circuit as claimed in claim 12, wherein said first and the second circuit components with monodirectional conduction characteristics are diodes, said first and second terminals of each of said diodes respectively being an anode and cathode thereof.

* * * * *